United States Patent
Newman (10) Patent No.: US 8,022,850 B2
(45) Date of Patent: Sep. 20, 2011

(54) MULTIPLE-BIT, DIGITAL-TO-ANALOG CONVERTERS AND CONVERSION METHODS

(75) Inventor: Bruce M. Newman, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 193 days.

(21) Appl. No.: 12/566,953

(22) Filed: Sep. 25, 2009

(65) Prior Publication Data

US 2011/0074613 A1    Mar. 31, 2011

(51) Int. Cl.
*H03M 1/66* (2006.01)
(52) U.S. Cl. .................. 341/144; 341/143; 341/155
(58) Field of Classification Search .................. 341/144, 341/141, 155, 143, 120, 118
See application file for complete search history.

(56) References Cited

U.S. PATENT DOCUMENTS

| | | | |
|---|---|---|---|
| 5,684,482 A | 11/1997 | Galton | |
| 6,577,261 B2 | 6/2003 | Brooks et al. | |
| 6,771,199 B2 | 8/2004 | Brooks et al. | |
| 7,079,063 B1* | 7/2006 | Nguyen et al. | 341/144 |
| 7,369,077 B2* | 5/2008 | Carroll | 341/153 |
| 2010/0328124 A1* | 12/2010 | O'Donnell et al. | 341/143 |
| 2011/0069840 A1* | 3/2011 | O'Donnell et al. | 380/287 |

* cited by examiner

*Primary Examiner* — Peguy Jean Pierre
(74) *Attorney, Agent, or Firm* — Ingrassia Fisher & Lorenz, P.C.

(57) ABSTRACT

Embodiments include DACs and methods for digital-to-analog conversion. A DAC includes an encoder and a plurality of DAC elements. The encoder maps each of a plurality of bits of a digital input value to one of the DAC elements, and produces a sign indication indicating whether a magnitude of the digital input value is above or below a threshold. Each DAC element produces a DAC element analog output signal that indicates whether a received sign indication and a received bit corresponds to a first state, a second state or a third state (e.g., a zero, positive or negative state). In an embodiment, the DAC uses positive historic mapping information when the magnitude of the digital input value is above the threshold, and negative historic mapping information when the magnitude of the digital input value is below the threshold. DAC elements may be configurable into a Return-to-Zero or a Non-Return-to-Zero mode.

20 Claims, 8 Drawing Sheets

MULTIPLE-BIT, DIGITAL-TO-ANALOG CONVERTERS AND CONVERSION METHODS

TECHNICAL FIELD

Embodiments relate to digital-to-analog converters (DACs) and digital-to-analog conversion methods implemented in DACs.

BACKGROUND

Multiple element, digital-to-analog converters (referred to herein as "multi-bit DACs") may be found in the feed-forward paths of delta-sigma digital-to-analog converters, the feedback paths of delta-sigma analog-to-digital converters, and in other types of circuitry. A typical multi-bit DAC includes a plurality of DAC elements, arranged in parallel with each other. Each DAC element is adapted to receive one bit of an encoded input signal and to produce an analog output signal that has one of two levels, depending on the input bit. Because each DAC element is used to process a single bit, the elements often are referred to as "single-bit" DAC elements. The analog output signals from the plurality of single-bit DAC elements are summed together to produce a differential, analog output signal.

Very large scale integration (VLSI) processing techniques are generally used to implement multiple-bit DACs. Accordingly, mismatches inherently are present in corresponding components of the plurality of single-bit DAC elements. Left uncompensated for, these mismatches may introduce significant conversion noise in the output signal, thus detrimentally affecting the signal-to-noise ratio (SNR) of the output signal. In order to reduce the conversion noise, some multi-bit DAC architectures perform spectral shaping of the static mismatch inherent in the single-bit DAC elements, although at the cost of higher switching activity. When dynamic mismatches also are present (e.g., rise/fall time variations), their effects tend to be amplified by the higher switching activity introduced by the spectral shaping process. In addition, because the output signals from each of the single-bit DAC elements contribute to the differential output signal of the multi-bit DAC, regardless of the value of the input bit, each of the single-bit DAC elements contributes noise to the signal path. This also has a detrimental effect on the SNR of the output signal. Accordingly, what are needed are multi-bit DACs and conversion methods that may have improved SNR performance over traditional multi-bit DACs.

DETAILED DESCRIPTION

Embodiments include multiple-bit, digital-to-analog converters (DACs) and digital-to-analog conversion methods. An encoder of a multiple-bit ("multi-bit") DAC includes an encoder (e.g., encoder 110, FIG. 1), which is configured to map the bits of a digital input value (e.g., a thermometer-encoded value) to a plurality of DAC elements (e.g., DAC elements 120-126, FIG. 1). According to an embodiment, the encoder produces a sign indication, indicating whether the digital input value is above or below a threshold (e.g., a threshold corresponding to a mid-point of a range of values that may be represented by a digital input value). Based on the sign indication and the magnitude of the bit that is mapped to each DAC element, each DAC element produces a DAC element analog output signal, which represents one of three states (e.g., a zero (Z) state, a positive (P) state or a negative (N) state). The DAC element analog output signals from the DAC elements are combined (e.g., by summing junction 128, FIG. 1) in order to produce an analog output signal of the DAC. More detail of various embodiments will now be described in conjunction with FIGS. 1-9.

Figure 1:
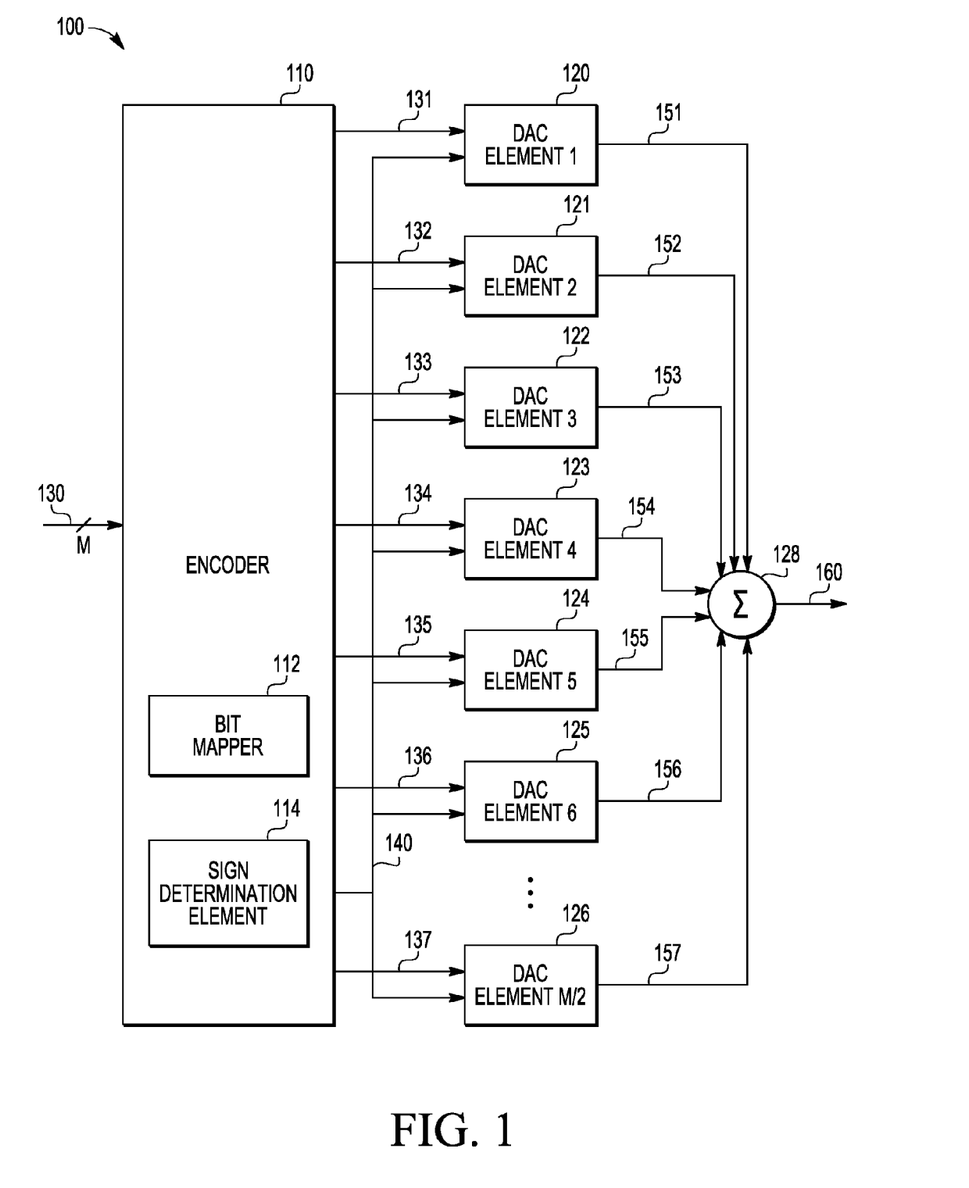
FIG. 1 illustrates a simplified block diagram of a multi-bit DAC, according to an example embodiment.

FIG. 1 illustrates a simplified block diagram of a multi-bit DAC 100, according to an example embodiment. Multi-bit DAC 100 includes an encoder 110, a plurality of DAC elements 120-126, and a summing element 128, according to an embodiment. Encoder 110 receives a sequence of digital input values, x(n), on DAC input lines 130, where n indicates the value number in the sequence input values, and x(n) is comprised of M bits of information, $x_1(n), x_2(n), \ldots x_M(n)$. The bits of each input value are received in parallel, according to an embodiment, although the bits may be received in series, in another embodiment. Each input value, x(n), may be considered to represent an integer having a value in a range from negative full scale (−FS) to positive full scale (+FS), where −FS may be represented by a value of 0, +FS may be represented by a value of M, and zero may be represented by a value of M/2, for example. According to an embodiment, the number of bits, M, is an even number that is a power of 2 (e.g., 8, 16 or 32 bits), although the number of bits may be a number other than a factorial of 2, in other embodiments.

In a particular embodiment, each input value, x(n), includes a thermometer encoded input value, so named because the format of the value is analogous to a mercury level in a mercury thermometer. In a mercury thermometer, the mercury always rises to the appropriate temperature, and no mercury is present above that temperature. Accordingly, in a multi-bit thermometer encoded input value, each value may be represented by zero to M positively valued, consecutive bits (e.g., logical "1s"), starting from the least significant bit (LSB) of the value. All bits above the positively valued bits have a negative or zero value (e.g., logical "0s"). For example, in an 8-bit thermometer encoded input value, a value of −FS may be represented as "00000000", a value of zero may be represented as "00001111" (LSB on the right), and a value of +FS may be represented as "11111111." In still other embodiments, the input values may include digital values other than thermometer encoded values.

For each received input value, x(n), encoder 110 is configured to produce a digital encoder output value, y(n), comprised of M/2 encoder output values, $y_1(n), y_2(n), \ldots y_{M/2}(n)$, on respective encoder output lines 131, 132, 133, 134, 135, 136, 137. According to an embodiment, encoder 110 includes a bit mapper 112, which is configured to produce each encoder output value by mapping combinations of bits of a corresponding input value, x(n), to one of the M/2 encoder output lines 131-137. For a particular input value, bit mapper 112 performs the mapping process based, in part, on stored information relating to bit mappings for previous input values (referred to herein as "historic bit mapping information"). Each encoder output value, $y_r(n)$, is produced such that the encoder output values produced on the M/2 encoder output lines 131-137 is related to the M bits within the corresponding input value, x(n). More particularly, and as will be described in further detail later, each encoder output value, $y_r(n)$, represents the magnitude of the thermometer code represented by the corresponding input value, x(n), although the encoder output value, $y_r(n)$, is represented using fewer bits, and may appear not to be a classically arranged thermometer code (i.e., with "1"s in the least significant bits and "0"s in the most significant bits). As will be explained in more detail below, the encoder output values, $y_r(n)$, are produced in a manner that may effectively compensate for mismatches that may be inherently present in corresponding components of the DAC elements 120-126, thus positively affecting the signal-to-noise ratio (SNR) of the analog output signal on output line 160.

In addition to performing bit mapping operations, encoder 110 also includes a sign determination element 114, which is configured to determine a sign of each received input value, x(n), and to output a signal indicative of the sign on output sign indication line 140, according to an embodiment. As mentioned above, bit mapper 112 performs bit mapping operations based on historic bit mapping information, and as will be described in more detail in conjunction with FIG. 2, later, encoder 110 is configured to store the historic bit mapping information for positively signed input values, x(n), in a first data storage area (e.g., positive history data storage 208, FIG. 2), and to store historic bit mapping information for negatively signed input values, x(n), in a second data storage area (e.g., negative history data storage 210, FIG. 2). Depending on the sign of a particular input value (as determined by encoder 110), bit mapper 112 performs the bit mapping operation using historic bit mapping information in either the first or second data storage areas. For example, when sign determination element 114 determines that a particular input value is a positively-signed value, bit mapper 112 uses historic bit mapping information in the first data storage area (e.g., positive history data storage 208, FIG. 2) in the bit mapping process. Conversely, when sign determination element 114 determines that a particular input value is a negatively-signed value, bit mapper 112 uses historic bit mapping information in the second data storage area (e.g., negative history data storage 210, FIG. 2) in the bit mapping process. Although the illustrated embodiment shows sign determination element 114 as being incorporated as a portion of encoder 110, sign determination element 114 may be separate from encoder 110, in another embodiment. In still another embodiment, the sign indication (or the converted thermometer code, described below) may be produced by a system component that precedes encoder 110 (e.g., digital quantizer 806 or T-code converter 807, FIG. 8, or M-bit ADC 906 or T-code converter 907, FIG. 9).

Each of DAC elements 120-126 is coupled to one of encoder output lines 131-137 and to sign indication line 140. DAC elements 120-126 operate to produce M/2 analog output signals $z_1(n), z_2(n), \ldots z_{M/2}(n)$ on respective DAC element output lines 151, 152, 153, 154, 155, 156, 157 according to:

$$z_r(n) = \begin{cases} X + e_r & \text{when } y_r(n) = 1 \\ -X - e_r & \text{when } y_r(n) = -1 \\ 0 & \text{when } y_r(n) = 0 \end{cases}$$

where $z_r(n)$ denotes the output of the $r^{th}$ DAC element, X is the amplitude of a theoretical, error-free analog output produced by a DAC element, and $e_r$ represents the difference, in $y_r(n)$, between an ideal current and an actual current in an embodiment that implements a current mode of operation (e.g., the error in the analog output). The DAC element output signals on DAC element output lines 151-157 may include currents, according to an embodiment, and each DAC element output signal is provided as an input to summing element 128, which sums the DAC element output signals to produce an analog output signal, a(n), on DAC output line 160. According to an embodiment, DAC element output lines 151-157 and DAC output line 160 are differential lines, and accordingly the currents produced on lines 151-157 and 160 are differential currents. For purposes of simplicity only, lines 151-157 and 160 are illustrated as being single ended. According to another embodiment, the DAC element output signals on DAC element output lines 151-157 may include capacitor charges that are provided to a summing junction of an amplifier, for example. Either way, the analog output signal, a(n), includes an analog representation of the magnitude of the corresponding digital input value, x(n), although the analog output signal also includes the cumulative errors included in the signals produced by each of the DAC elements 120-126. The otherwise detrimental effects of some of these errors are mitigated through the mapping process performed by bit mapper 112. As will be described in more detail in conjunction with FIGS. 4-6, potential errors also are mitigated by shunting current away from the signal path for those of DAC elements 120-126 that receive encoder output values, $y_r(n)$, of zero, according to an embodiment.

Figure 2:
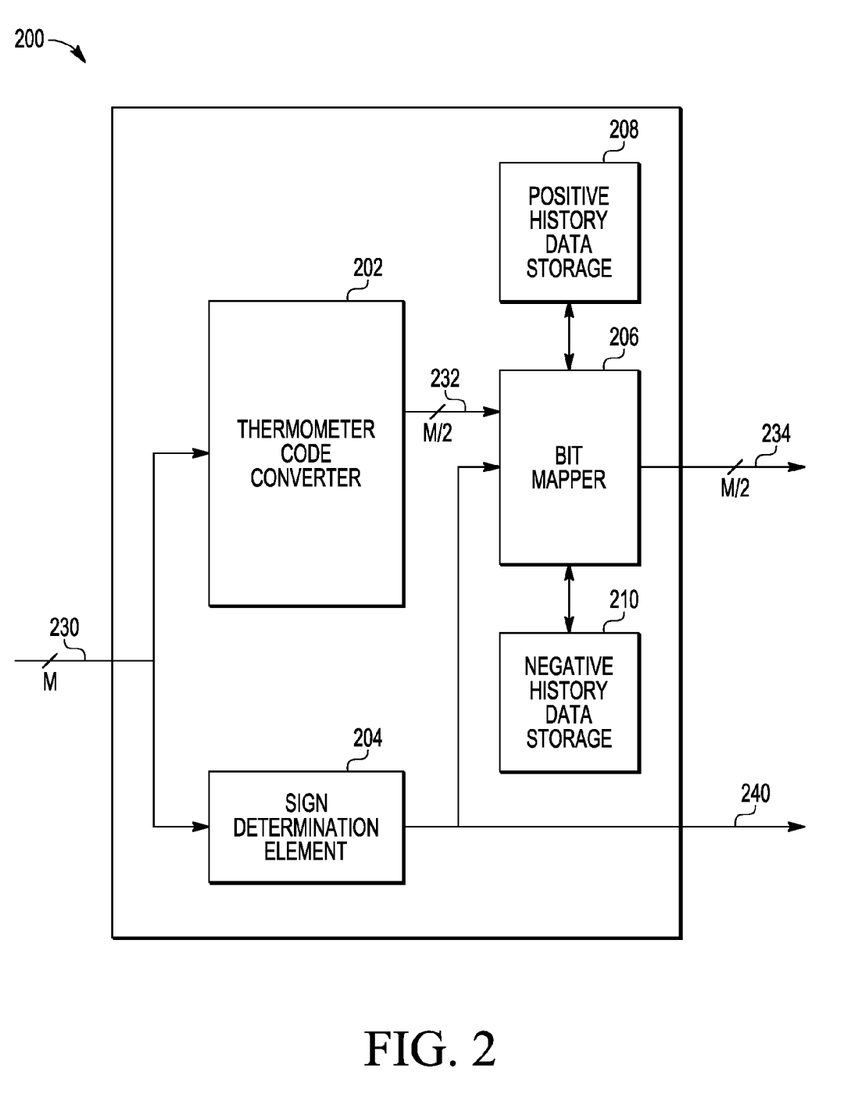
FIG. 2 illustrates a simplified block diagram of an encoder, according to an example embodiment.

FIG. 2 illustrates a simplified block diagram of an encoder 200 (e.g., encoder 110, FIG. 1), according to an example embodiment. Encoder 200 includes a thermometer code converter 202, a sign determination element 204 (e.g., sign determination element 114, FIG. 1), a bit mapper 206 (e.g., bit mapper 112, FIG. 1), positive history data storage 208, and negative history data storage 210, according to an embodiment. Thermometer code converter 202 receives a sequence of digital input values, x(n), on input lines 230, where each value is a thermometer encoded input value comprised of M input bits, $x_1(n), x_2(n), \ldots x_M(n)$. According to an embodiment, and as will be described in more detail in conjunction with FIG. 3, thermometer code converter 202 converts each thermometer encoded input value into a converted thermometer code, which represents the magnitude of the input thermometer code, and outputs the converted thermometer code on converter output lines 232. Each converted thermometer code includes M/2 bits, according to an embodiment, which are provided to bit mapper 206. In addition, sign determination element 204 receives one or more bits of each digital input value, and produces a sign indication on sign indication line 240.

Figure 3:
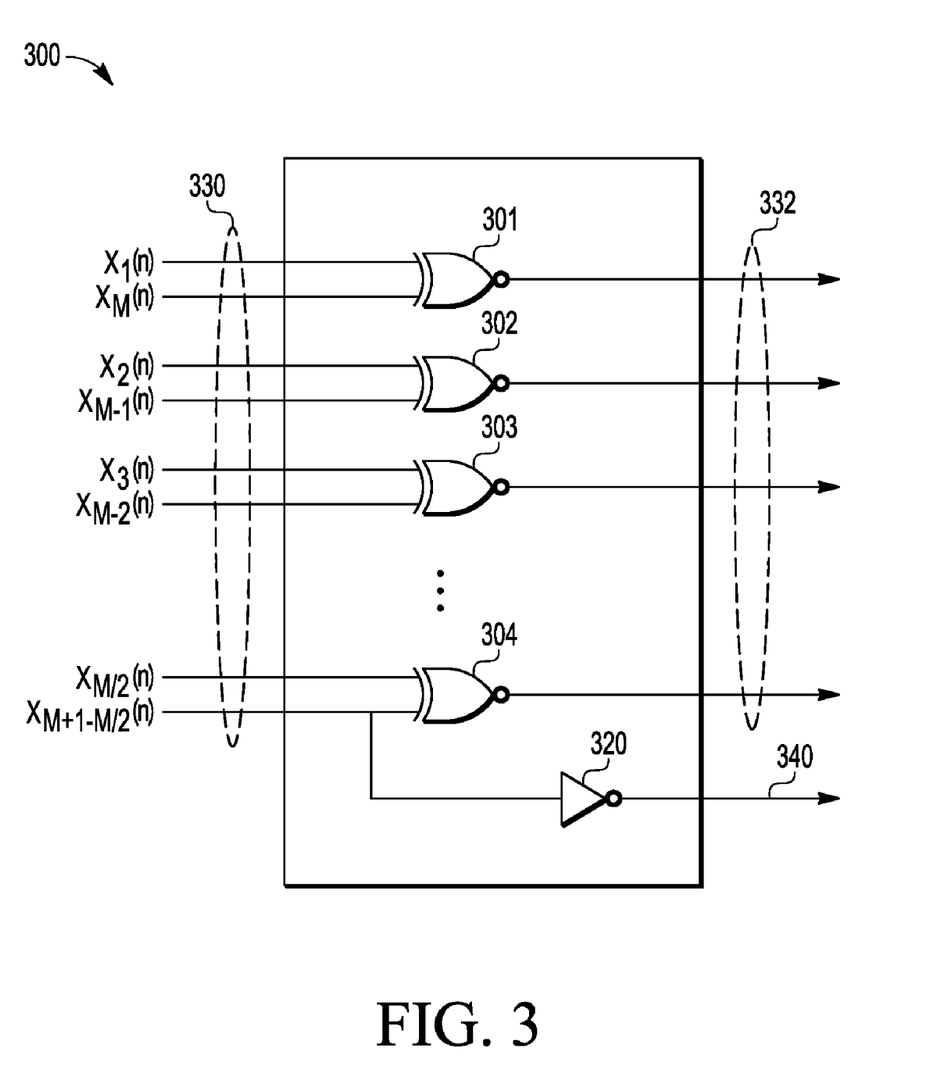
FIG. 3 illustrates a simplified logic diagram of a thermometer code converter, according to an embodiment.

FIG. 3 illustrates a simplified logic diagram of a thermometer code converter and sign determination element 300 (e.g., thermometer code converter 202 and sign determination element 204, FIG. 2), according to an embodiment. Thermometer code converter and sign determination element 300 includes a plurality of exclusive NOR (XNOR) gates 301, 302, 303, 304 adapted to convert each digital input value received on input lines 330 (e.g., each input thermometer code received on input lines 230, FIG. 2) into a converted thermometer code, according to an embodiment. In addition, thermometer code converter and sign determination element 300 includes an inverter 320 adapted to indicate a sign of each digital input value.

Each XNOR gate 301-304 receives a different pair of bits of each digital input value, performs an equivalence operation on the received pair of bits, and produces a result on converter output lines 332. According to an embodiment, the pair of thermometer code bits provided to any particular XNOR gate 301-304 includes a first bit, $x_i(n)$, and a second bit, $x_{M+1-i}(n)$, where i is the bit number within the thermometer code, and i=1 . . . M. For example, in an embodiment in which each thermometer code is an 8-bit value, a first XNOR gate 301 receives bits $x_1(n)$ and $x_8(n)$ of an input thermometer code, a second XNOR gate 302 receives bits $x_2(n)$ and $x_7(n)$ of the input thermometer code, a third XNOR gate 303 receives bits $x_3(n)$ and $x_6(n)$ of the input thermometer code, and a fourth XNOR gate 304 receives bits $x_4(n)$ and $x_5(n)$ of the input thermometer code. As the above example indicates, the thermometer code converter (e.g., XNOR gates 301-304) essentially folds each input thermometer code about its center to pair bits $x_i(n)$ and $x_{M+1-i}(n)$, and determines equivalences of resulting pairs of bits in order to produce a converted thermometer code that includes M/2 bits (e.g., on converter output lines 332). Said another way, the thermometer code converter converts the thermometer-encoded value by pairing together symmetrically opposite bits of the thermometer code (e.g., symmetrically opposite about the center of the code) and performing equivalence operations on each pair to produce the converted thermometer code. The pairing operation enables the multi-bit DAC (e.g., multi-bit DAC 100, FIG. 1) to include half as many DAC elements (e.g., DAC elements 120-126, FIG. 1) when compared with a conventional multi-bit DAC. According to an embodiment, each DAC element may carry about twice the current as a DAC element of a conventional multi-bit DAC, in order to produce an analog output signal (e.g., on output line 160, FIG. 1) having a comparable magnitude as a magnitude of an output signal produced by a conventional multi-bit DAC.

Inverter 320 receives a single bit of each digital input value, inverts the bit, and, on sign indication line 340, indicates a sign of the digital input value based on the value of the received bit. According to an embodiment, inverter 320 receives a central bit of each digital input value. For example, for an M-bit digital input value, inverter 320 may receive bit $x_{M+1-(m/2)}(n)$, according to an embodiment. According to another embodiment, inverter 320 may receive bit $x_{M-(M/2)}(n)$. When each thermometer code is an 8-bit value, for example, inverter 320 may receive and invert the fourth bit or the fifth bit, in order to indicate the sign of the thermometer code.

Although in the above described example the sign is indicated by inverting a central bit of a received digital input value, another embodiment may indicate the sign as a non-inverted (e.g., original) value of a central bit. Both embodiments are intended to be included in the scope of the inventive subject matter, although only the embodiment that includes inverting the central bit is discussed in detail herein. In addition, although thermometer code converter and sign determination element 300 is shown to be implemented using XNOR gates 301-304 and inverter 320, according to an embodiment, it is to be understood that thermometer code converter and sign determination element 300 may be implemented using different types of logical elements, in other embodiments, while still producing a converted thermometer code and a sign indication. Accordingly, the illustrated and described embodiment is not intended to limit that aspect of the inventive subject matter to a single implementation.

Referring again to FIG. 2, the converted thermometer code produced on converter output lines 232 (e.g., converter output lines 332, FIG. 3) and the sign indication produced on sign indication line 240 (e.g., sign indication line 340, FIG. 3) is provided to bit mapper 206. Bit mapper 206 is adapted to map each of the bits of the converted thermometer code to one of M/2 DAC elements (e.g., DAC elements 120-126, FIG. 1). Various known mapping algorithms (e.g., "mismatch shaping algorithms") may be implemented within bit mapper 206. For example, but not by way of limitation, a mapping algorithm may implement a data weighted averaging process, a spectral shaping algorithm that may include multiple order noise-shaping, or one of various other mapping algorithms.

Regardless of the mapping algorithm that is implemented, historic data regarding one or more mapping operations performed for one or more previously-received digital input values is used by bit mapper 206 during the mapping process. According to an embodiment, historic mapping data for positively-signed digital input values is stored within and retrieved from positive history data storage 208, and historic mapping data for negatively-signed digital input values is stored within and retrieved from negative history data storage 210. Positive history data storage 208 and negative history data storage 210 may be implemented as random access memory (RAM) (e.g., registers or other data storage or memory elements) within encoder 200, according to an embodiment. In other embodiments, positive history data storage 208 and/or negative history data storage 210 may be implemented as data storage elements that are distinct from (but accessible to) encoder 200 (e.g., external RAM).

When the sign indication received on sign indication line 240 indicates a positive sign for the digital input value, bit mapper 206 retrieves historic mapping data from positive history data storage 208, and performs the mapping operation using the retrieved historic mapping data. Bit mapper 206 also stores information regarding the result of the current mapping operation into positive history data storage 208 to be used for a subsequently-processed, positively-signed digital input value. Conversely, when the sign indication received on sign indication line 240 indicates a negative sign for the digital input value, bit mapper 206 retrieves historic mapping data from negative history data storage 210, and performs the mapping operation using the retrieved historic mapping data. Bit mapper 206 also stores information regarding the result of the current mapping operation into negative history data storage 210 to be used for a subsequently-processed, negatively-signed, digital input value. Bit mapper 206 produces a digital encoder output value, y(n), comprised of M/2 encoder output values, $y_1(n), y_2(n), \ldots y_{M/2}(n)$, on encoder output lines 234 (e.g., encoder output lines 131-137, FIG. 1).

Although, in FIG. 2, the illustrated embodiment shows sign determination element 204, positive history data storage 208, and negative history data storage 210 as being incorporated as portions of encoder 200 (e.g., included within a same semiconductor chip), any or all of sign determination element 204, positive history data storage 208, and/or negative history data storage 210 may be separate from (but accessible to) encoder 200, in other embodiments.

Referring again to FIG. 1, and as discussed previously, the digital encoder output value, y(n), produced on encoder output lines 131-137 (e.g., encoder output lines 234, FIG. 2) are received by the plurality of DAC elements 120-126. In addition, each of the DAC elements 120-126 receives a sign indication on sign indication line 140 (e.g., sign indication line 240, FIG. 2). According to an embodiment, each DAC element 120-126 produces an analog output signal, z(n), on a DAC element output line 151-157, which reflects the magnitude of the corresponding received encoder output value. The DAC element output signals on DAC element output lines 151-157 include currents, according to an embodiment, and each DAC element output signal is provided as an input to summing element 128, which sums the DAC element output signals to produce an analog output signal, a(n), on DAC output line 160. Embodiments of a DAC element (e.g., one of DAC elements 120-126) that produce analog output currents will now be described in conjunction with FIGS. 4-6. The below-described embodiments are not intended to limit the scope of the inventive subject matter only to current-producing DAC elements. In contrast, and as mentioned above, other embodiments may include DAC elements that produce output signals in the form of charges that are provided to a summing junction of an amplifier (rather than currents provided to summing element 128), or DAC elements that operate in a voltage mode.

Figure 4:
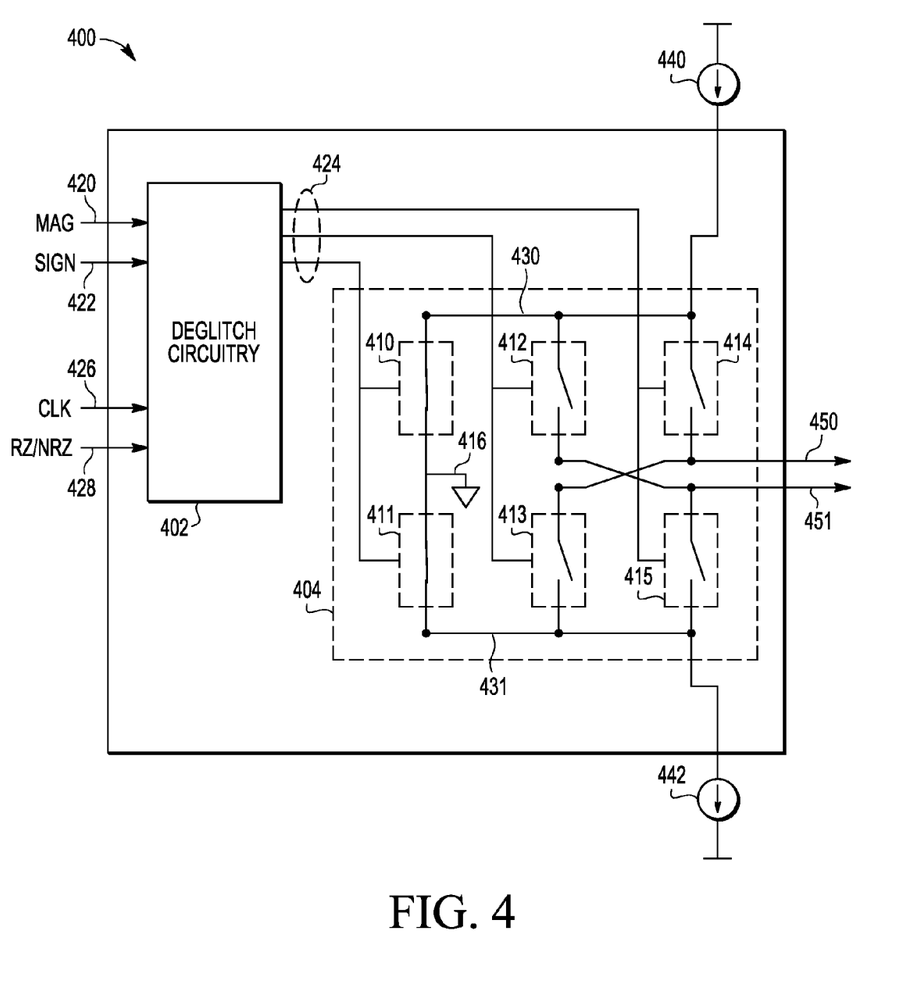
FIG. 4 illustrates a simplified block diagram of a DAC element in a first configuration, according to an example embodiment.

FIG. 4 illustrates a simplified block diagram of a DAC element 400 (e.g., one of DAC elements 120-126, FIG. 1) in a first configuration, according to an example embodiment. DAC element 400 includes deglitch circuitry 402 and a switching network 404. Depending on an input signal to the DAC element 400 (e.g., from encoder 110, FIG. 1), the DAC element may produce essentially no output signal (in a Z state), a positively valued analog output signal (in a P state) or a negatively valued analog output signal (in an N state) on DAC element output line 450, as will be described in detail below.

Deglitch circuitry 402 is adapted to receive one of the digital encoder output values, $y_r(n)$, (referred to also as a "DAC element input magnitude values" or "MAG") on a magnitude input line 420 (e.g., one of encoder output lines 131-137, FIG. 1 or encoder output lines 234, FIG. 2), where the index r identifies the $r^{th}$ DAC element. In addition, deglitch circuitry 402 is adapted to receive a sign indication, $s_r(n)$ ("SIGN"), on sign indication line 422 (e.g., sign indication line 140, FIG. 1 or sign indication line 240, FIG. 2). Based on the received DAC element input magnitude and the sign indication, deglitch circuitry 402 controls the states of switches within switching network 404 (e.g., whether each of the switches is in a conducting ("closed") state or a non-conducting ("open") state). Accordingly, deglitch circuitry 402 is coupled to the control terminals (e.g., gates) of the switches of switching network 404 through control lines 424. Deglitch circuitry 402 is clocked through a clock signal received on clock input line 426.

According to an embodiment, up to four possible combinations of DAC element input magnitudes and sign indications may be received during operation of the DAC element 400. Each received combination is processed by deglitch circuitry 402 to identify the input signals as corresponding to one of three types of input signals or three "states": zero (Z), positive (P), and negative (N). According to a particular embodiment, the identification of the type of input signal for a received magnitude and sign combination (e.g., during a particular clock cycle) is determined by deglitch circuitry 402 according to the following truth table:

| SIGN | MAG | Z | P | N | state |
|------|-----|---|---|---|-------|
| 0    | 0   | 1 | 0 | 0 | Z     |
| 0    | 1   | 0 | 1 | 0 | P     |
| 1    | 0   | 1 | 0 | 0 | Z     |
| 1    | 1   | 0 | 0 | 1 | N     |

Figure 5:
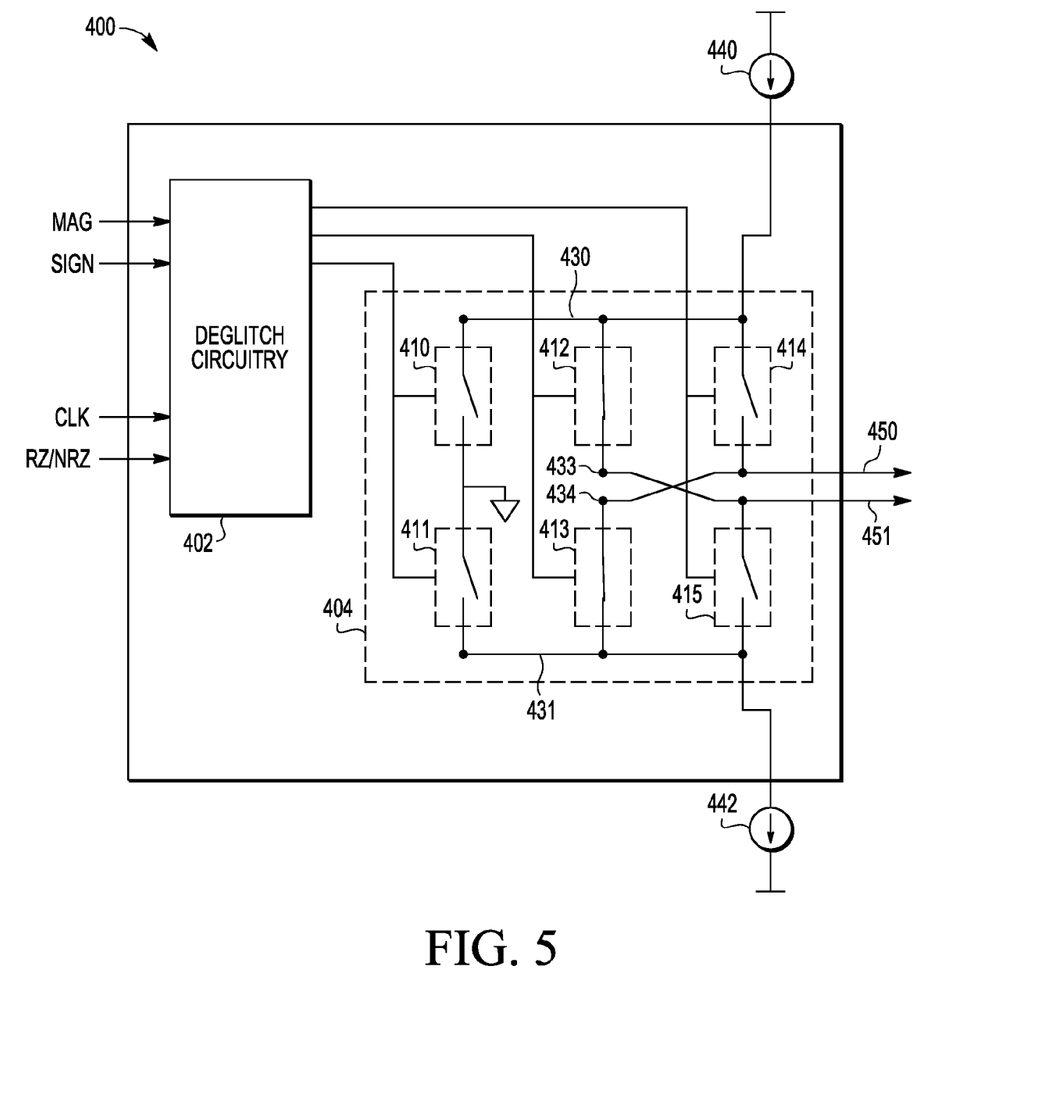
FIG. 5 illustrates a simplified block diagram of a DAC element in a second configuration, according to an example embodiment.
Figure 6:
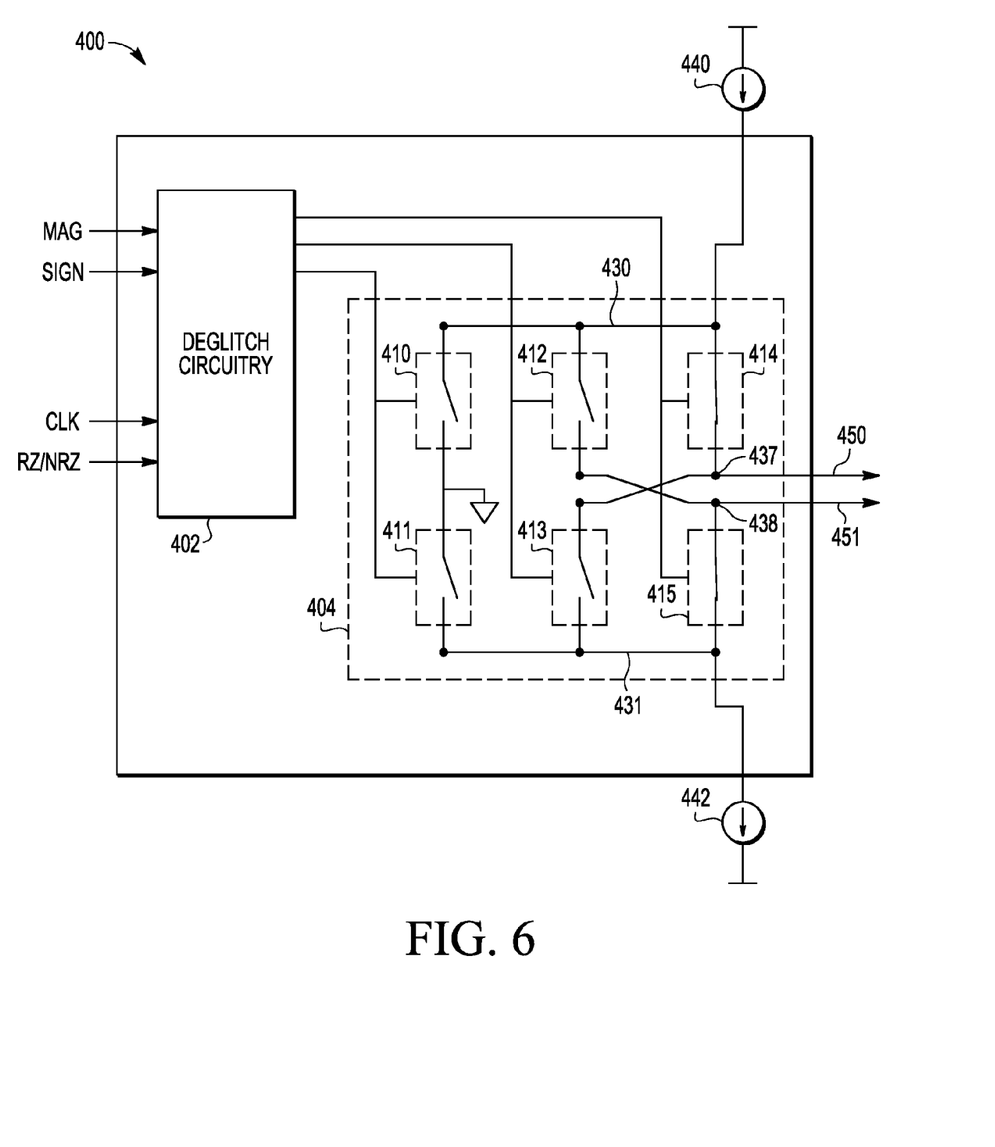
FIG. 6 illustrates a simplified block diagram of a DAC element in a third configuration, according to an example embodiment.

When deglitch circuitry 402 determines that a current input signal corresponds to a Z type of input signal, deglitch circuitry 402 produces control signals on control lines 424 that place the switching network 404 into a Z-state configuration, as illustrated in FIG. 4. Conversely, when deglitch circuitry 402 determines that the input signal corresponds to a P type of input signal, deglitch circuitry 402 produces control signals on control lines 424 that place the switching network 404 into a P-state configuration, as illustrated in FIG. 5 and described in more detail later. Finally, when deglitch circuitry 402 determines that the input signal corresponds to an N type of input signal, deglitch circuitry 402 produces control signals on control lines 424 that place the switching network 404 into an N-state configuration, as illustrated in FIG. 6 and described in more detail later. According to an embodiment, deglitch circuitry 402 is adapted to produce the control signals on control lines 424 that cause switches 410-415 to change states in a make-before-break manner.

According to an embodiment, the operation of deglitch circuitry 402 is affected not only by the DAC element input magnitude and sign indication received for a given clock cycle (the "current input"), but also by the received DAC element input magnitude and sign indication corresponding to an immediately preceding clock cycle (the "prior input"). In other words, the type of transition between consecutive clock cycles (e.g., from Z-to-P, Z-to-N, P-to-Z, N-to-Z, P-to-N or N-to-P) affects the operation of deglitch circuitry 402. According to an embodiment, deglitch circuitry 402 is configured to determine which type of transition is occurring, as will be explained in more detail below.

In a particular embodiment, a DAC may be configured in a Return-to-Zero (RZ) mode or a Non-Return-to-Zero (NRZ) mode, where the RZ/NRZ mode indication is received on RZ/NRZ control line 428. In an RZ mode, all transitions between consecutively received DAC element input magnitude values (e.g., from one clock cycle to the next) will be between Z and either P or N (or vice versa) for all DAC elements 400. Accordingly, transitions directly between P and N (or vice versa) will not be permitted to occur when the DAC is configured in RZ mode. Conversely, in an NRZ mode, transitions directly between P and N (without any intervening Z transition) are possible. According to an embodiment, when the DAC is configured in NRZ mode, the logic implemented by deglitch circuitry 402 to determine which type of transition is occurring depends on the prior input and the current input. When the DAC is configured in RZ mode, the logic implemented by deglitch circuitry 402 to determine which type of transition is occurring depends only on the current input, since one of the prior input or the current input will always correspond to a Z input. An embodiment of logic implemented by the deglitch circuitry 402 may be defined as follows:

$$P\text{-}Z = (\overline{y_r(n)} + s_r(n)) \cdot (\overline{y_r(n-1)} + s_r(n-1)) \cdot \overline{NRZ} + s_r(n) \cdot 19\, RZ$$

$$N\text{-}Z = (\overline{y_r(n)} + s_r(n)) \cdot (\overline{y_r(n-1)} + s_r(n-1)) \cdot \overline{NRZ} + s_r(n) \cdot RZ$$

$$P\text{-}N = (s_r(n) \oplus s_r(n-1)) \cdot y_r(n) \cdot y_r(n-1) \cdot NRZ,$$

where NRZ indicates whether the DAC is configured in an NRZ mode (e.g., "0" is no and "1" is yes), and RZ indicates whether the DAC is configured in RZ mode (e.g., "0" is no and "1" is yes). When true, P-Z indicates a P-to-Z or a Z-to-P transition, N-Z indicates an N-to-Z or Z-to-N transition, and P-N indicates a P-to-N or N-to-P transition. During operation, only one of P-Z, N-Z or P-N would be true during any given clock cycle. It should be noted that, when the DAC is configured in the RZ mode, P-N types of transitions would not occur. In alternate embodiments, a DAC may be configured to support only an RZ or an NRZ mode, but not both. In such alternate embodiments, the RZ/NRZ control logic may be excluded from the system, and the logic to determine which type of transition is occurring may be simplified.

According to an embodiment, deglitch circuitry 402 includes two deglitching latches. A first latch handles transitions between Z and P or N (e.g., in RZ or NRZ mode), and a second latch handles transitions directly between P and N (e.g., in NRZ mode). By providing two deglitching latches, the switches within switching network 404 may be controlled to ensure make-before-break operation. Upon the determination of the current state (e.g., Z, N, or P) and the type of state transition (e.g., P-Z, N-Z or P-N), deglitch circuitry 402 controls the states of switches within switching network 404, as mentioned previously, using control signals provided on control lines 424.

According to an embodiment, the switching network 404 includes a first switch set 410, 411, a second switch set 412, 413, and a third switch set 414, 415, and during operation, the states of switches 410-415 determine the magnitude and sign of a differential current produced on first and second differential output lines 450, 451. The switches 410-415 within switching network 404 may include, for example, NMOS transistors, PMOS transistors, or other types of switch elements. According to an embodiment, the first switch set 410, 411 includes two switches coupled to analog ground 416 (mid-supply). According to an embodiment, the differential output produced on differential output lines 450, 451 is centered around a common mode point, and the analog ground 416 is established at approximately the common mode point. A first node of the set 410, 411 is coupled to a first node 430, which in turn is coupled to a current source 440. Accordingly, node 430 is referred to below as a "current source node 430". A second node of the set 410, 411 is coupled to a second node 431, which in turn is coupled to a current sink 442. Accordingly, node 431 is referred to below as a "current sink node 431". The current source 440 may be coupled to a supply voltage, and the current sink 442 may be coupled to ground, according to an embodiment. The current source 440 and the current sink 442 may be implemented by legs of a current mirror, according to an embodiment, although this is not essential.

In the configuration shown in FIG. 4, the switches in the first switch set 410, 411 are in a conducting state (e.g., both switches 410, 411 are closed), and the switches in the second and third switch sets 412-415 are in a non-conducting state (e.g., all switches 412-415 are open). According to an embodiment, deglitch circuitry 402 is adapted to configure the first switch set 410, 411 into the conducting state when deglitch circuitry determines that the current input (e.g., the current DAC element input magnitude value and the current sign indication) corresponds to a Z state. When controlled into a conducting state, as illustrated in FIG. 4, the first switch set 410, 411 conducts current directly from the current source 440 to the current sink 442, and any difference in the currents conducts to analog ground 416. Accordingly, in the configuration corresponding to the Z state (i.e., the configuration shown in FIG. 4), substantially all of the current is shunted away from the differential output lines 450, 451 (e.g., little or no current is produced at differential output lines 450, 451), and accordingly the DAC element 400 effectively does not contribute a DAC element output signal (e.g., one of the signals on lines 151-157 that are provided to summing element 128, FIG. 1). Said another way, an embodiment includes implementing a DAC element in which a central value (Z) is defined between a positive value (P) and a negative value (N), and the DAC elements avoid producing contributions along the signal path when they receive inputs that correspond to the central value. Accordingly, embodiments avoid introducing noise into the signal path for inputs that correspond to the central value. In conventional DACs, each DAC element contributes a signal having a non-zero magnitude, and accordingly each DAC element may introduce noise into the signal path.

FIG. 5 illustrates a simplified block diagram of a DAC element 400 in a second configuration, according to an example embodiment. In contrast to the configuration of FIG. 4, in the configuration shown in FIG. 5, the switches in the second switch set 412, 413 are in a conducting state (e.g., both switches 412, 413 are closed), and the switches in the first and third switch sets 410, 411, 414, 415 are in a non-conducting state (e.g., all switches 410, 411, 414, 415 are open). According to an embodiment, the second switch set 412, 413 includes a first switch 412 having a first node coupled to the current source node 430, and a second node 433 coupled to the second differential output line 451. The second switch set also includes a second switch 413 having a first node 434 coupled to the first differential output line 450, and a second node coupled to the current sink node 431.

According to an embodiment, deglitch circuitry 402 is adapted to configure the second switch set 412, 413 into the conducting state when deglitch circuitry determines that the current input (e.g., the current DAC element input magnitude value and the current sign indication) corresponds to an N state. When controlled into a conducting state, as illustrated in FIG. 5, the second switch set 412, 413 produces a current drain at the first differential output line 450 and a positive current at the second differential output line 451. Accordingly, in the N state, a negative signal is produced across the differential output lines 450, 451. The negative signal will be a contributory DAC element output signal (e.g., one of the signals on lines 151-157 that are provided to summing element 128, FIG. 1).

FIG. 6 illustrates a simplified block diagram of a DAC element 400 in a third configuration, according to an example embodiment. In contrast to the configurations of FIGS. 4 and 5, in the configuration shown in FIG. 6, the switches in the third switch set 414, 415 are in a conducting state (e.g., both switches 414, 415 are closed), and the switches in the first and second switch sets 410-413 are in a non-conducting state (e.g., all switches 410-413 are open). According to an embodiment, the third switch set 414, 415 includes a first switch 414 having a first node coupled to the current source node 430, and a second node 437 coupled to the first differential output line 450. The third switch set also includes a second switch 415 having a first node 438 coupled to the second differential output line 451, and a second node coupled to the current sink node 431.

According to an embodiment, deglitch circuitry 402 is adapted to configure the third switch set 414, 415 into the conducting state when deglitch circuitry determines that the current input (e.g., the current DAC element input magnitude value and the current sign indication) corresponds to a P state. When controlled into a conducting state, as illustrated in FIG.

6, the third switch set 414, 415 produces a positive signal at the first differential output line 450 and a current drain at the second differential output line 451. Accordingly, in the P state, a positive signal is produced across the differential output lines 450, 451. The positive signal will be a contributory DAC element output signal (e.g., one of the signals on lines 151-157 that are provided to summing element 128, FIG. 1).

Although, in FIGS. 4-6, a particularly arranged array of switches is shown within switching network 404, it is to be understood that various other switching arrangements and/or arrays may be implemented, which achieve substantially the same results. Accordingly, the particular switching arrangement and even the particular DAC element arrangement shown in FIGS. 4-6 are not intended to limit the scope of the inventive subject matter.

Figure 7:
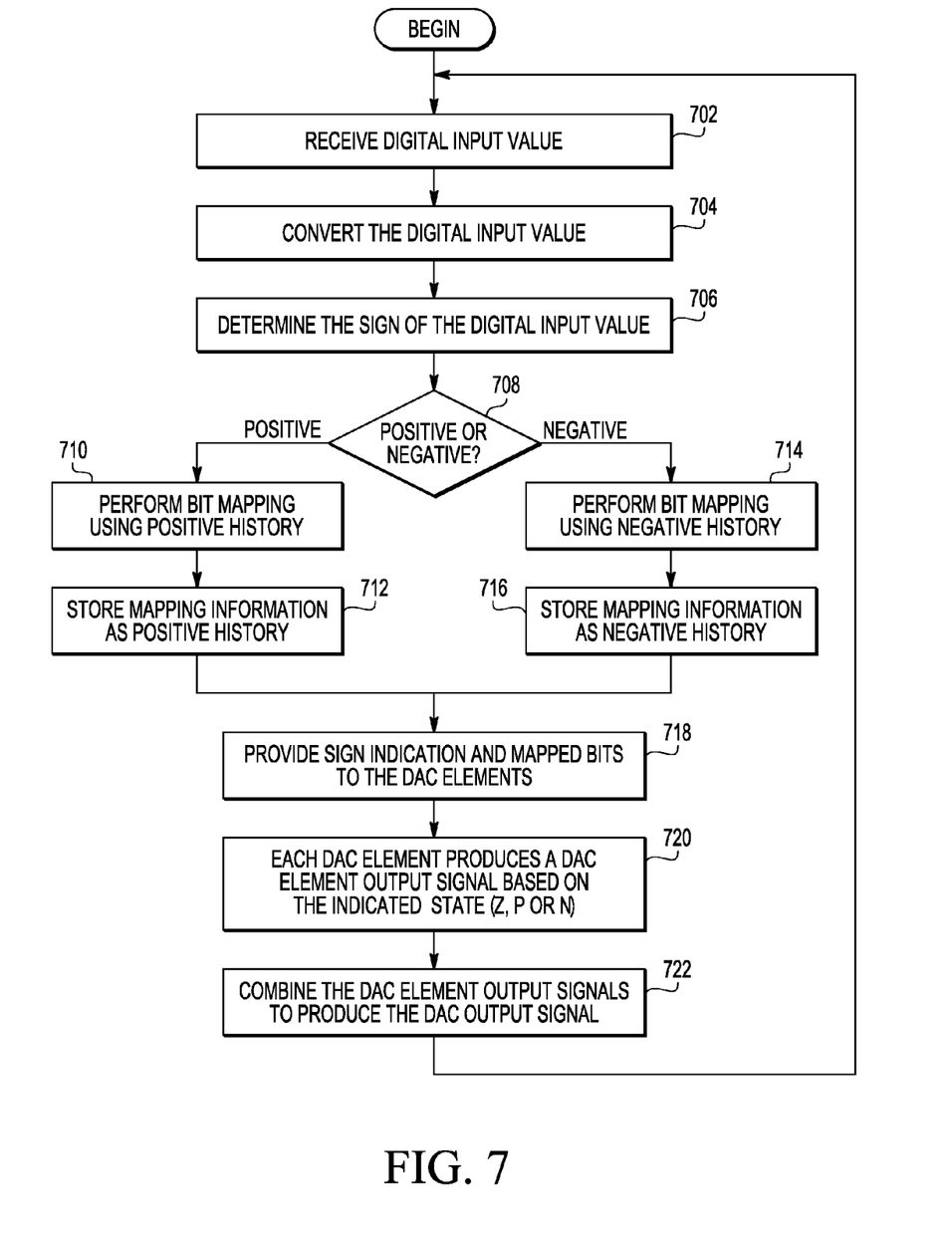
FIG. 7 is a flowchart of a method for performing a digital-to-analog conversion using a multi-bit DAC, according to an example embodiment.

FIG. 7 is a flowchart of a method for performing a digital-to-analog conversion using a multi-bit DAC (e.g., DAC 100, FIG. 1), according to an example embodiment. The method may begin, in block 702, by receiving an M-bit, digital input value, x(n) (e.g., on DAC input lines 130, FIG. 1). According to an embodiment, the digital input value is a thermometer encoded value, the bits of which are received in parallel. According to another embodiment, a value other than a thermometer encoded value may be received, and the value may be converted to a thermometer encoded value by the DAC.

In block 704, the digital input value is converted (e.g., by thermometer code converter 202, FIG. 2). According to an embodiment, the digital input value is converted by effectively folding the digital input value about its center, and performing a logical XNOR operation on corresponding pairs of bits. Accordingly, the conversion operation results in a digital value that includes half the number of bits of the digital input value.

In block 706, a sign of the digital input value is determined (e.g., by sign determination element 114, FIG. 1), and a sign indication is produced (e.g., on sign indication line 140, FIG. 1). When the digital input value is a thermometer encoded value, for example, a sign of the digital value may be determined from a central bit of the digital input value (e.g., the fourth or fifth bit of an 8-bit thermometer code). The sign indication may be an inverted version of the central bit or a non-inverted version of the central bit, according to various embodiments.

In block 708, a determination is made whether the sign has been determined to be positive or negative. When the sign has been determined to be positive, then in block 710, a bit mapping operation is performed (e.g., by bit mapper 112, FIG. 1) in order to map each of the bits of the converted, positively-signed, digital input value to a DAC element (e.g., one of DAC elements 120-126, FIG. 1). For the positively-signed, digital input value, the bit mapping operation is performed by retrieving (e.g., from positive history data storage 208, FIG. 2) and using historic mapping data for one or more previously-received, positively-signed digital input values ("positive historic data"). According to an embodiment, the mapping operation may include performing a data weighted averaging process using the positive historic data. According to another embodiment, the mapping operation may include performing a spectral shaping algorithm using the positive historic data, where the spectral shaping algorithm may include multiple order noise-shaping. In other embodiments, other types of mapping algorithms or mismatch shaping algorithms may be implemented. Upon completion of the bit mapping operation, historic mapping data for the current digital input value is then stored as positive mapping history data, in block 712 (e.g., in positive history data storage 208, FIG. 2).

Conversely, when the sign has been determined to be negative (in block 708), then in block 714, a bit mapping operation is performed (e.g., by bit mapper 112, FIG. 1) in order to map each of the bits of the converted, negatively-signed, digital input value to a DAC element (e.g., one of DAC elements 120-126, FIG. 1). For the negatively-signed, digital input value, the bit mapping operation is performed by retrieving (e.g., from negative history data storage 210, FIG. 2) and using historic mapping data for one or more previously-received, negatively-signed digital input values ("negative historic data"). As was the case when the sign was determined to be positive, the mapping operation may include performing a data weighted averaging process using the negative historic data, according to an embodiment. According to another embodiment, the mapping operation may include performing a spectral shaping algorithm using the negative historic data. In other embodiments, other types of mapping algorithms or mismatch shaping algorithms may be implemented. Upon completion of the bit mapping operation, historic mapping data for the current digital input value is then stored as negative mapping history data, in block 716 (e.g., in negative history data storage 210, FIG. 2).

In block 718, the sign indication and the mapped bits are provided to a plurality of DAC elements (e.g., DAC elements 120-126, FIG. 1). The various combinations of sign indications and bit values may represent one of three possible states: zero (Z), positive (P), and negative (N). According to an embodiment, each DAC element produces a DAC element output signal (e.g., a current, a voltage and/or a charge) based on the state indicated by the received sign indication and input bit, in block 720. In a particular embodiment, each DAC element may include a switching network (e.g., switching network 404, FIGS. 4-6), which may be configured to shunt current away from the signal path when the sign indication and input bit indicate the Z-state.

In block 722, the DAC element output signals are combined (e.g., by summing element 128, FIG. 1) to produce a DAC output signal (e.g., on DAC output signal line 160, FIG. 1). The method then iterates, as shown in FIG. 7, to process the next received digital input value. It is to be understood that certain ones of the process blocks depicted in FIG. 7 may be performed in parallel with each other or with performing other processes. For example, processes performed within the DAC elements (e.g., DAC elements 120-126, FIG. 1) for a given digital input value may be performed in parallel with processes performed within the encoder (e.g., encoder 110, FIG. 1) for a subsequently-received digital input value. In addition, it is to be understood that the particular ordering of the process blocks depicted in FIG. 7 may be modified, while achieving substantially the same result. Accordingly, such modifications are intended to be included within the scope of the inventive subject matter.

Embodiments of multi-bit DACs described above may be incorporated into various types of systems. Two non-limiting examples of such systems are illustrated and described in conjunction with FIGS. 8 and 9. It is to be understood that embodiments of multi-bit DACs may be incorporated into other types of systems, as well.

Figure 8:
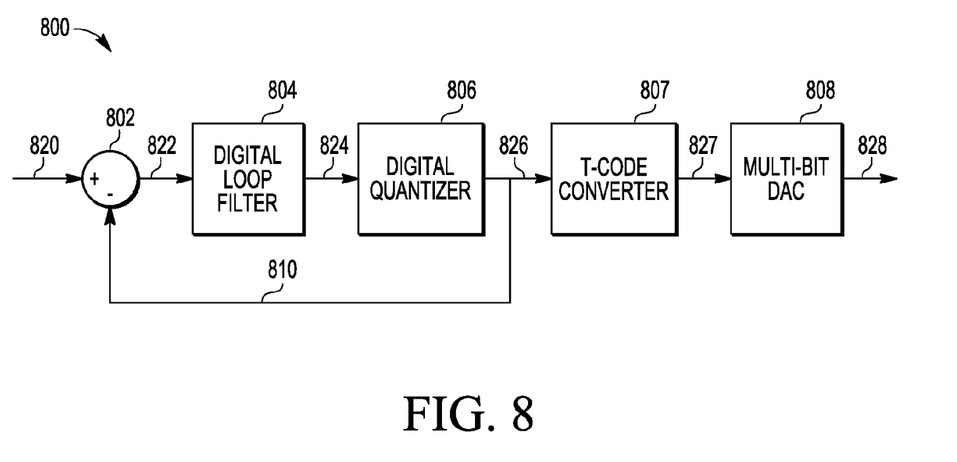
FIG. 8 illustrates a simplified block diagram of a sigma-delta converter within which a multi-bit DAC is incorporated, according to an example embodiment.

FIG. 8 illustrates a simplified block diagram of a sigma-delta converter 800 within which a multi-bit DAC is incorporated, according to an example embodiment. Sigma delta converter 800 includes a difference junction 802, a digital loop filter 804, a digital quantizer 806, a thermometer code converter 807, a multi-bit DAC 808, and a feedback path 810, according to an embodiment. Sigma-delta converter 800 receives a digital signal, which may include a sequence of thermometer encoded digital values 820, according to an embodiment. The digital values 820 may, for example, be received from an interpolation filter (not illustrated), which may receive relatively low-frequency, high-resolution digital values (not illustrated), interpolate the values to increase the sample rate, and produce the digital values 820 as relatively high-frequency, high-resolution values. Difference junction 802 subtracts a feedback value provided on feedback path 810 from each received digital value 820, to produce an error value 822. Digital loop filter 804 filters the error value 822 to produce a filtered error value 824. Digital quantizer 806 quantizes the filtered error value 824 into a predetermined number of levels, and outputs an M-bit digital value 826 (e.g., a thermometer encoded digital value). The M-bit digital value 826 is provided through the feedback path 810 to difference junction 802, for subtraction from a subsequently received digital value 820. In addition, the M-bit digital value 826 is processed by T-code converter 807, which converts each M-bit digital value 826 to a $2^{M-1}$ bit code and a sign indication (collectively signal 827). Signal 827 is processed by multi-bit DAC 808, which performs mismatch shaping and digital-to-analog conversion, as described above in accordance with FIGS. 1-7, in order to produce an analog output signal 828. According to an embodiment, the analog output signal 828 may include a differential current signal. According to other embodiments, the analog output signal 828 may include a charge or a voltage differential signal.

Figure 9:
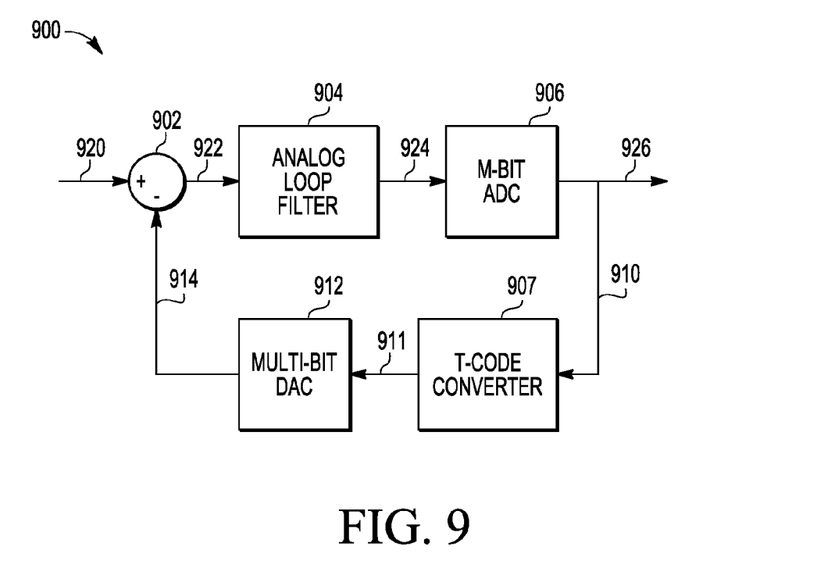
FIG. 9 illustrates a simplified block diagram of a sigma-delta modulator, within which a multi-bit DAC is incorporated, according to another example embodiment.

FIG. 9 illustrates a simplified block diagram of a sigma-delta modulator 900, within which a multi-bit DAC 912 is incorporated, according to another example embodiment. Sigma-delta modulator 900 includes a difference junction 902, an analog loop filter 904, an M-bit analog-to-digital converter (ADC) 906, a T-code converter 907, a multi-bit DAC 912, and a feedback path 910, 914, according to an embodiment. Difference junction 902 receives an analog input signal 920, and subtracts an analog feedback signal provided on feedback path 914 from the analog input signal 920, in order to produce an error signal 922. Analog loop filter 904 filters the error signal 922 to produce a filtered error signal 924. M-bit ADC 906 converts the filtered error signal 924 into a sequence of M-bit digital values 926. According to an embodiment, the M-bit digital values 926 include thermometer encoded digital values 926 produced at a relatively high-frequency sample rate. The digital values 926 may subsequently be processed by a decimation filter (not illustrated), according to an embodiment, which may decimate the digital values 926 to produce digital samples (not illustrated) at a relatively low-frequency sample rate. In addition, the M-bit digital values 926 are provided through the feedback path 910 to T-code converter 907, which converts each M-bit digital value 926 to an M/2 bit code and a sign indication (collectively signal 911). Signal 911 is processed by multi-bit DAC 912, which performs mismatch shaping and digital-to-analog conversion, as described above in accordance with FIGS. 1-7, in order to produce the analog feedback signal on feedback path 914 for difference junction 902. According to an embodiment, the signals 920, 922, 924, and the signals produced by multi-bit DAC 912 (on feedback path 914) may include differential current signals. According to other embodiments, those signals may include charges or voltage differential signals.

Thus, various embodiments of methods and apparatus for multiple-element DACs and digital-to-analog conversion methods have been described above. An embodiment includes a digital-to-analog converter (DAC) that includes an encoder and a plurality of DAC elements. The encoder is configured to perform a mapping operation to map each of a plurality of bits of a digital input value to one of the plurality of DAC elements, and to produce a sign indication that indicates whether a magnitude of the digital input value is above or below a threshold. The plurality of DAC elements are operatively coupled to the encoder, and each DAC element of the plurality of DAC elements receives the sign indication and a bit of the plurality of bits from the encoder. Each DAC element produces a DAC element analog output signal that indicates whether a received sign indication and a received bit corresponds to a first state, a second state or a third state. According to a further embodiment, the DAC also includes a summing junction, operatively coupled to the plurality of DAC elements, and configured to combine DAC element analog output signals from the plurality of DAC elements to produce an analog output signal of the DAC.

According to a further embodiment, the DAC also includes positive history data storage configured to store positive historic mapping information for positively-signed digital input values, and negative history data storage configured to store negative historic mapping information for negatively-signed digital input values. In such an embodiment, the encoder is configured to access and use the positive historic mapping information during the mapping operation when the magnitude of the digital input value is above the threshold, and the encoder is configured to access and use the negative historic mapping information during the mapping operation when the magnitude of the digital input value is below the threshold.

According to a further embodiment, the digital input value is a thermometer-encoded value, and the encoder includes a thermometer code converter configured to convert the thermometer-encoded value by pairing together symmetrically opposite bits of the thermometer-encoded value and performing equivalence operations on each pair to produce a converted thermometer-encoded value. According to a further embodiment, the thermometer code converter includes a plurality of XNOR gates, each configured to receive a pair of bits of the thermometer-encoded value and to perform an equivalence operation on the pair of bits. According to a further embodiment the encoder includes a sign determination element configured to produce the sign indication based on a value of a central bit of the digital input value.

According to a further embodiment, a DAC element of the plurality of DAC elements includes circuitry configured to make a determination of whether the received sign indication and the received bit corresponds to the first state, the second state or the third state, and to produce switch control signals according to the determination, and a switching network configured to route currents in response to the switch control signals in order to affect the DAC element analog output signal. According to a further embodiment, when the circuitry makes a determination that the received sign indication and the received bit corresponds to the first state, the circuitry is configured to produce first switch control signals that cause the switching network to route currents away from a signal path of the DAC. When the circuitry makes a determination that the received sign indication and the received bit corresponds to the second state, the circuitry is configured to produce second switch control signals that cause the DAC to produce a positively-valued, DAC element analog output signal. When the circuitry makes a determination that the received sign indication and the received bit corresponds to the first state, the circuitry is configured to produce third switch control signals that cause the DAC to produce a negatively-valued, DAC element analog output signal. According to a further embodiment, the first state corresponds to a zero (Z) state, the second state corresponds to a positive (P) state, and the third state corresponds to a negative (N) state, and the DAC element is configurable into a Return-to-Zero (RZ) mode or a Non-Return-to-Zero (NRZ) mode. When configured in the RZ mode, transitions directly between the P state and the N state are not permitted to occur, and when configured in the NRZ mode, transitions directly between the P state and the N state are permitted to occur. According to a further embodiment, the circuitry is configured to produce the switch control signals that cause switches of the switching network to change states in a make-before-break manner. According to a further embodiment, the first state corresponds to a zero (Z) state, the second state corresponds to a positive (P) state, and the third state corresponds to a negative (N) state, and for any given clock cycle, the plurality DAC elements either: are all in the Z state, are all in the P state, are all in the N state, are all in the Z state or the P state, or are all in the Z state or the N state, and never include a DAC element in the P state simultaneously with a DAC element in the N state.

Another embodiment includes a DAC configured to convert digital input values into an analog output signal, which includes positive history data storage, negative history data storage, an encoder, and a plurality of DAC elements. The positive history data storage is configured to store positive historic mapping information for positively-signed digital input values, and the negative history data storage is configured to store negative historic mapping information for negatively-signed digital input values. The encoder, which is operatively coupled to the positive history data storage and to the negative history data storage, is configured to determine whether a magnitude of a digital input value is above or below a threshold, and to perform a mapping operation to map each of a plurality of bits of the digital input value to one of a plurality of DAC elements. The encoder is configured to access and use the positive historic mapping information during the mapping operation when the magnitude of the digital input value is above the threshold, and the encoder is configured to access and use the negative historic mapping information during the mapping operation when the magnitude of the digital input value is below the threshold. The plurality of DAC elements are operatively coupled to the encoder. Each DAC element of the plurality of DAC elements is configured to receive a bit of the plurality of bits from the encoder and an indication of whether the magnitude is above or below the threshold, and each DAC element is further configured to produce a DAC element analog output signal based on whether a received indication and a received bit corresponds to a zero (Z) state, a positive (P) state or a negative (N) state. According to a further embodiment, for any given clock cycle, the plurality DAC elements will not produce a positive DAC element analog output signal and a negative DAC element analog output signal simultaneously.

Yet another embodiment includes method for performing digital-to-analog conversion by a digital-to-analog converter (DAC). The method includes the steps of receiving a digital input value, and determining whether a magnitude of the digital input value is above or below a threshold. When the magnitude of the digital input value is above the threshold, the method includes performing a mapping operation to map each of a plurality of bits of the digital input value to one of a plurality of DAC elements using positive historic mapping information. When the magnitude of the digital input value is below the threshold, the method includes performing the mapping operation to map each of the plurality of bits of the digital input value to one of the plurality of DAC elements using negative historic mapping information. Each of the plurality of DAC elements produce a DAC element analog output signal based on whether the magnitude of the digital input value is above or below the threshold, and based on a magnitude of a bit received in response to the mapping operation.

According to a further embodiment, the digital input value is a thermometer-encoded value, and the method further includes, prior to the mapping operation converting the thermometer-encoded value into a converted thermometer-encoded value by pairing together symmetrically opposite bits of the thermometer-encoded value and performing equivalence operations on each pair to produce the converted thermometer-encoded value. According to a further embodiment, producing the DAC element analog output signal includes, for each DAC element, when a bit mapped to the DAC has a zero magnitude, producing a zero-valued DAC element analog output signal by routing currents away from a signal path. When a bit mapped to the DAC has a non-zero magnitude and the magnitude of the digital input value is above the threshold, the method includes producing a positive-valued DAC element analog output signal. When a bit mapped to the DAC has a non-zero magnitude and the magnitude of the digital input value is below the threshold, the method includes producing a negative-valued DAC element analog output signal. According to a further embodiment, the method includes combining DAC element analog output signals from the plurality of DAC elements to produce an analog output signal of the DAC.

It is to be understood that various modifications may be made to the above-described embodiments without departing from the scope of the inventive subject matter. While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A digital-to-analog converter (DAC) comprising:
    an encoder configured to perform a mapping operation to map each of a plurality of bits of a digital input value to one of a plurality of DAC elements, and to produce a sign indication that indicates whether a magnitude of the digital input value is above or below a threshold; and
    the plurality of DAC elements, operatively coupled to the encoder, wherein each DAC element of the plurality of DAC elements receives the sign indication and a bit of the plurality of bits from the encoder, and each DAC element produces a DAC element analog output signal that indicates whether a received sign indication and a received bit corresponds to a first state, a second state or a third state.

2. The DAC of claim 1, wherein the DAC further comprises:
    positive history data storage configured to store positive historic mapping information for positively-signed digital input values; and negative history data storage configured to store negative historic mapping information for negatively-signed digital input values, and wherein the encoder is configured to access and use the positive historic mapping information during the mapping operation when the magnitude of the digital input value is above the threshold, and the encoder is configured to access and use the negative historic mapping information during the mapping operation when the magnitude of the digital input value is below the threshold.

3. The DAC of claim 1, wherein the digital input value is a thermometer-encoded value, and the encoder comprises:

a thermometer code converter configured to convert the thermometer-encoded value by pairing together symmetrically opposite bits of the thermometer-encoded value and performing equivalence operations on each pair to produce a converted thermometer-encoded value.

4. The DAC of claim 3, wherein the thermometer code converter comprises:

a plurality of XNOR gates, each configured to receive a pair of bits of the thermometer-encoded value and to perform an equivalence operation on the pair of bits.

5. The DAC of claim 1, wherein the encoder comprises:
a sign determination element configured to produce the sign indication based on a value of a central bit of the digital input value.

6. The DAC of claim 1, wherein a DAC element of the plurality of DAC elements comprises:

circuitry configured to make a determination of whether the received sign indication and the received bit corresponds to the first state, the second state or the third state, and to produce switch control signals according to the determination; and a switching network configured to route currents in response to the switch control signals in order to affect the DAC element analog output signal.

7. The DAC of claim 6, wherein:

when the circuitry makes a determination that the received sign indication and the received bit corresponds to the first state, the circuitry is configured to produce first switch control signals that cause the switching network to route currents away from a signal path of the DAC;

when the circuitry makes a determination that the received sign indication and the received bit corresponds to the second state, the circuitry is configured to produce second switch control signals that cause the DAC to produce a positively-valued DAC element analog output signal; and when the circuitry makes a determination that the received sign indication and the received bit corresponds to the first state, the circuitry is configured to produce third switch control signals that cause the DAC to produce a negatively-valued DAC element analog output signal.

8. The DAC of claim 6, wherein the first state corresponds to a zero (Z) state, the second state corresponds to a positive (P) state, and the third state corresponds to a negative (N) state, and wherein:

the DAC element is configurable into a Return-to-Zero (RZ) mode or a Non-Return-to-Zero (NRZ) mode, and when configured in the RZ mode, transitions directly between the P state and the N state are not permitted to occur, and when configured in the NRZ mode, transitions directly between the P state and the N state are permitted to occur.

9. The DAC of claim 6, wherein the circuitry is configured to produce the switch control signals that cause switches of the switching network to change states in a make-before-break manner.

10. The DAC of claim 1, wherein the first state corresponds to a zero (Z) state, the second state corresponds to a positive (P) state, and the third state corresponds to a negative (N) state, and for any given clock cycle, the plurality DAC elements never include a DAC element in the P state simultaneously with a DAC element in the N state, and either:

are all in the Z state,
are all in the P state,
are all in the N state,
are all in the Z state or the P state, or
are all in the Z state or the N state.

11. The DAC of claim 1, further comprising a summing junction, operatively coupled to the plurality of DAC elements, and configured to combine DAC element analog output signals from the plurality of DAC elements to produce an analog output signal of the DAC.

12. A digital-to-analog converter (DAC) configured to convert digital input values into an analog output signal, the DAC comprising:

positive history data storage configured to store positive historic mapping information for positively-signed digital input values;

negative history data storage configured to store negative historic mapping information for negatively-signed digital input values;

an encoder, operatively coupled to the positive history data storage and to the negative history data storage, and configured to determine whether a magnitude of a digital input value is above or below a threshold, and to perform a mapping operation to map each of a plurality of bits of the digital input value to one of a plurality of DAC elements, wherein the encoder is configured to access and use the positive historic mapping information during the mapping operation when the magnitude of the digital input value is above the threshold, and the encoder is configured to access and use the negative historic mapping information during the mapping operation when the magnitude of the digital input value is below the threshold; and the plurality of DAC elements, operatively coupled to the encoder, wherein each DAC element of the plurality of DAC elements is configured to receive a bit of the plurality of bits from the encoder and an indication of whether the magnitude is above or below the threshold, and wherein each DAC element is further configured to produce a DAC element analog output signal based on whether a received indication and a received bit corresponds to a zero (Z) state, a positive (P) state or a negative (N) state.

13. The DAC of claim 12, wherein the digital input value is a thermometer-encoded value, and the encoder comprises:

a thermometer code converter configured to convert the thermometer-encoded value by pairing together symmetrically opposite bits of the thermometer-encoded value and performing equivalence operations on each pair to produce a converted thermometer-encoded value.

14. The DAC of claim 12, wherein a DAC element of the plurality of DAC elements comprises:

circuitry configured to make the determination of whether the received indication and the received bit corresponds to the Z state, the P state or the N state, and to produce switch control signals according to the determination; and a switching network configured to route currents in response to the switch control signals in order to affect the DAC element analog output signal.

15. The DAC of claim 14, wherein the circuitry is configured to produce the switch control signals that cause switches of the switching network to change states in a make-before-break manner.

16. The DAC of claim 12, wherein for any given clock cycle, the plurality DAC elements will not produce a positive DAC element analog output signal and a negative DAC element analog output signal simultaneously.

17. A method for performing digital-to-analog conversion performed by a digital-to-analog converter (DAC), the method comprising the steps of:
receiving a digital input value;
determining whether a magnitude of the digital input value is above or below a threshold;
when the magnitude of the digital input value is above the threshold, performing a mapping operation to map each of a plurality of bits of the digital input value to one of a plurality of DAC elements using positive historic mapping information;
when the magnitude of the digital input value is below the threshold, performing the mapping operation to map each of the plurality of bits of the digital input value to one of the plurality of DAC elements using negative historic mapping information; and
each of the plurality of DAC elements producing a DAC element analog output signal based on whether the magnitude of the digital input value is above or below the threshold, and based on a magnitude of a bit received in response to the mapping operation.

18. The method of claim 17, wherein the digital input value is a thermometer-encoded value, and wherein the method further comprises, prior to the mapping operation:
converting the thermometer-encoded value into a converted thermometer-encoded value by pairing together symmetrically opposite bits of the thermometer-encoded value and performing equivalence operations on each pair to produce the converted thermometer-encoded value.

19. The method of claim 17, wherein, for each DAC element, producing the DAC element analog output signal comprises:
when a bit mapped to the DAC has a zero magnitude, producing a zero-valued DAC element analog output signal by routing currents away from a signal path;
when a bit mapped to the DAC has a non-zero magnitude and the magnitude of the digital input value is above the threshold, producing a positive-valued DAC element analog output signal; and
when a bit mapped to the DAC has a non-zero magnitude and the magnitude of the digital input value is below the threshold, producing a negative-valued DAC element analog output signal.

20. The method of claim 17, further comprising combining DAC element analog output signals from the plurality of DAC elements to produce an analog output signal of the DAC.

* * * * *